United States Patent [19]

Heil et al.

[11] Patent Number: 4,475,145
[45] Date of Patent: Oct. 2, 1984

[54] CIRCUIT BOARD HEATSINK ASSEMBLY AND TECHNIQUE

[75] Inventors: Dale L. Heil, Marion; Mark D. Goodsmith, Cedar Rapids, both of Iowa

[73] Assignee: Rockwell International Corporation, El Segundo, Calif.

[21] Appl. No.: 397,644

[22] Filed: Jul. 12, 1982

[51] Int. Cl.³ .............................................. H05K 7/20
[52] U.S. Cl. ...................................... 361/386; 361/388
[58] Field of Search ................ 361/386, 387, 388, 395, 361/399, 414; 174/52 R, 72; 29/840, 846, 852

[56] References Cited

U.S. PATENT DOCUMENTS

| Re. 29,683 | 6/1978 | Ocken | 174/52 R |
|---|---|---|---|
| 3,124,640 | 3/1964 | Armstrong | 174/72 |
| 3,293,353 | 12/1966 | Hendriks et al. | 29/852 |
| 3,354,542 | 11/1967 | Mallia | 29/625 |
| 3,509,429 | 4/1970 | Craig et al. | 357/66 |
| 3,531,579 | 9/1970 | Katz | 174/68.5 |
| 3,585,455 | 6/1971 | Naylor | 361/407 |
| 3,758,350 | 9/1973 | Weglin | 156/8 |
| 4,029,999 | 6/1977 | Neumann et al. | 361/386 |
| 4,204,248 | 6/1980 | Proffit et al. | 361/388 |

FOREIGN PATENT DOCUMENTS 1365877 9/1974 United Kingdom ............... 361/387

Primary Examiner—J. V. Truhe
Assistant Examiner—Greg Thompson
Attorney, Agent, or Firm—George A. Montanye; H. Fredrick Hamann

[57] ABSTRACT

A printed circuit heatsink technique and assembly is disclosed which increases the heat dissipating capabilities of a printed circuit assembly. A thermally conductive plate is etched using the same artwork or mask employed to define the patterns of terminals and conductive areas on one surface of a printed circuit board. The plate is etched in those regions corresponding to the terminal and conductive areas so that holes are produced in the terminal areas and channels are produced in the conductive areas. The plate is then bonded to the printed circuit board prior to the attachment of the leads of electronic components through the holes formed in the thermally conductive plate. The assembly absorbs heat generated by the electronic components and provides a greater surface area for dissipating that heat without the need for specially fabricated heatsink elements or complex milling procedures.

18 Claims, 4 Drawing Figures

CIRCUIT BOARD HEATSINK ASSEMBLY AND TECHNIQUE

The Government has rights in this invention pursuant to contract F04701-79-C-0083, awarded by the Department of the Air Force.

BACKGROUND OF THE INVENTION

The present invention relates to heat sinking techniques and assemblies for use in connection with circuit boards and more particularly to a technique and structure for significantly increasing the heat dissipating capabilities of a printed circuit assembly.

One of the major problems encountered in the prior art construction and use of printed circuits is the inability to effectively dissipate heat generated by the components in a particular electronic apparatus. As the technology advances and greater numbers of components are used in connection with individual printed circuit boards, more heat will be generated than is capable of being dissipated by conventional heat sinking techniques. The heat sinking capability is further decreased by the assembly configurations of such structures which often require a plurality of closely stacked printed circuit boards that allow little room for convection cooling or conventional heat dissipating fins or large heat dissipating attachments. Naturally, any addition of heat dissipating structures of large size would defeat attempts to provide more components in smaller areas for reducing the size of the electronic devices in which the boards are employed.

Various attempts have been made to overcome the problems created by the heat generated in printed circuits by the associated electronic components. In one such technique, the electrically conductive areas on the printed circuit boards were increased in size to provide a greater area for radiating heat. Rather than using small conductive areas to interconnect the terminals to which the electronic components are attached, the conductive areas are made larger and only thin insulating strips are formed between those conductive areas. Any heat generated by the electronic components and transferred to the conductive areas is then radiated from a larger area and capable of more efficiently dissipating the heat. Alternatively, a conductive backing plate can be applied to an opposite side of the circuit board. The backing plate is configured to have insulating areas in the region of the respective terminals, which allows the conductive plate to be attached to the opposite side of the printed circuit board to enhance heat dissipation. In both cases, the heat dissipation is allegedly improved by the increase in radiating surface area produced by the increased size in the conductive surface areas. While the above technique may be effective in reducing heat build-up and improving heat dissipation, the same relies primarily upon air convection to dissipate heat and requires special techniques to form the conductive areas and backing plate.

In another prior art technique, a thermally conducting cushion-like elastomeric pad is molded with recesses on one surface to fit over the electronic components on a printed circuit board. The opposite surface of the cushion is maintained in contact with a heatsink and the heat generated in the electronic components is then transferred through the pad and removed by the heatsink. While this technique may also improve the heat dissipating capabilities of the printed circuit assembly, the process of forming the recesses is complicated and the size of the thermal pad and required heatsink prevents close spacing of the printed circuit boards or a reduction in their size for more compact construction.

In still other prior art techniques, thermally conductive pads are physically attached to selected areas on the side of circuit boards opposite to that containing the circuit components. In this example, the opposite surface of the circuit module is fabricated to include various geometric pads which correspond to the shapes of the electronic components on the circuit surface. The module is then dip-soldered to produce a projection whose shape is similar to that of the pad geometry. The projections formed on the surface of the module then provide a plurality of heatsinks having various shapes and sizes for dissipating heat produced by the electronic components. While improvements in heat dissipation may be achieved using this technique, the forming process is complex and the structure primarily relies on surface convection for cooling.

Although each of the above techniques attempt to provide improved heat dissipating capabilities, the same require numerous fabrication steps and each is restricted to particular board geometries and types. There is therefore a continuing need for techniques and assemblies which can be easily performed and constructed, yet provide more effective heat dissipation in environments requiring more closely spaced boards and a greater number of components. Accordingly, the invention has been developed to overcome the shortcomings of the above known and similar techniques and to provide a heat dissipating tehcnique and printed circuit heatsink assembly which is easily fabricated using simplified procedures.

SUMMARY OF THE INVENTION

In accordance with the present invention, the artwork or etching masks of conventional screening or photoetching techniques are used to lay out and produce a printed circuit board which may have terminals and conductive strips formed in particular areas on either or both sides of the printed circuit board. A thermally conductive plate having two opposed sides is etched (using the artwork or mask employed to produce the terminals and conductive strips on one side of the circuit board) in order to define a pattern of areas on one side of said plate corresponding to the pattern of terminal and conductive areas on the printed circuit board. The defined areas are formed to produce holes in the terminal areas and channels in the surface of the plate corresponding to the conductive areas. The plate is then attached to the surface of the printed circuit board using an adhesive and aligned so that there is no physical contact between the terminal and conductive areas and the thermally conductive plate. Electronic components are then attached to the terminal areas of the printed circuit board by extending the leads of the components through the holes in the thermally conductive plate and soldering or otherwise attaching the leads to the terminals. In use, any heat radiated by the electronic components or generated in the electrically conductive terminals or conductive strips, is radiated and absorbed by the thermally conductive plate and may be transferred to and carried away by a mounting bracket in which the printed circuit board is secured or by other thermally conductive devices placed in contact with the thermally conductive plate.

It is therefore a feature of the invention to provide a heatsink assembly which improves heat dissipation.

Another feature of the invention is to provide a simplified and inexpensive technique for more quickly forming printed circuit heatsink assemblies.

It is a further feature of the invention to provide a technique for forming a printed circuit heatsink assembly which includes the formation of a heat dissipating plate between the circuit components and printed circuit board yet insulated from the terminal and conductive areas.

Still another feature of the invention is to provide a technique for forming a heat dissipating printed circuit assembly by etching a thermally conductive plate with the artwork used to form the terminals and conductive areas on a printed circuit board.

A further feature of the invention is to provide a printed circuit heatsink assembly which allows closer spacing of multiple boards and increased density of circuit components.

These and other advantages and novel features of the invention will become apparent from the following detailed description when considered with the accompanying drawings wherein:

DETAILED DESCRIPTION OF A PREFERRED EMBODIMENT

Figure 1:
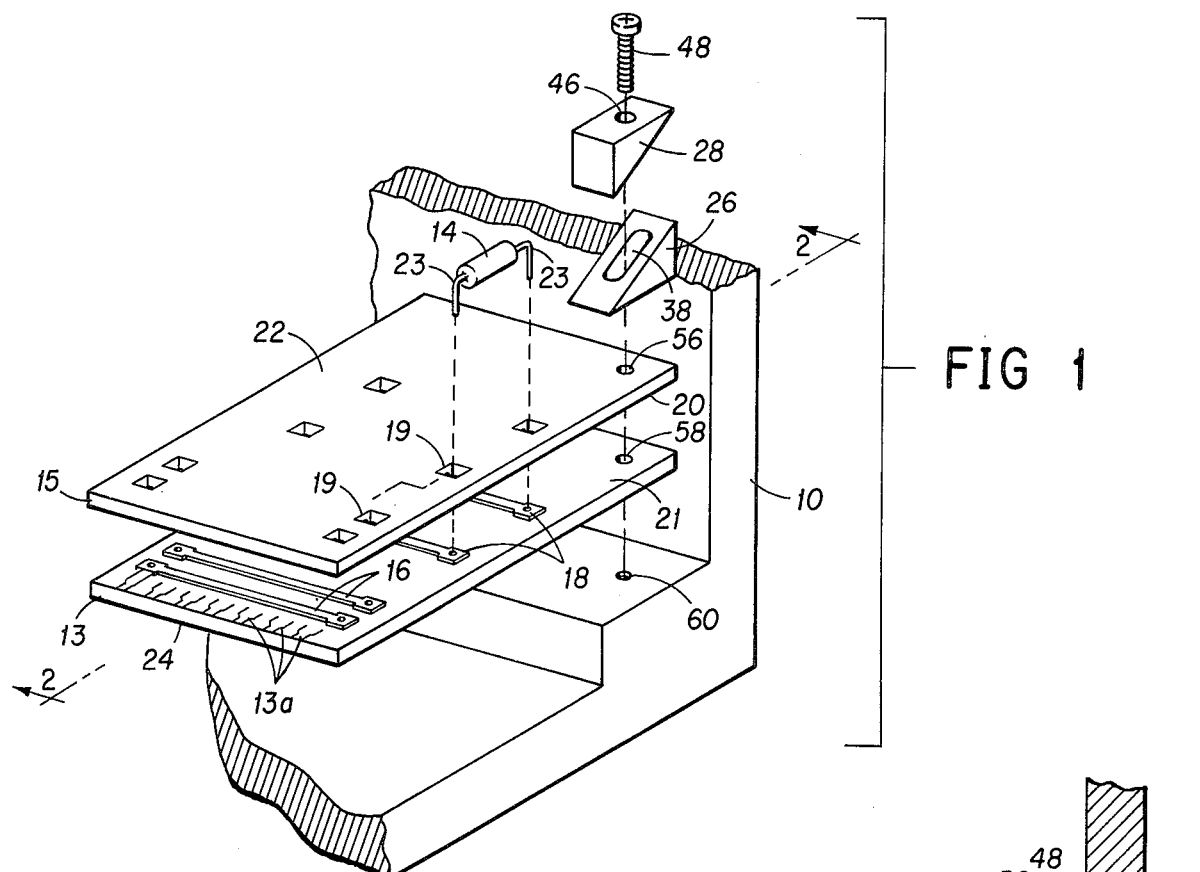
FIG. 1 is an exploded perspective view of the printed circuit heatsink assembly in accordance with the present invention.

Referring now to the drawings, wherein like numerals are used to refer to like elements throughout, one embodiment of the improved circuit heatsink assembly and technique is disclosed. It should be noted that although the invention will be described with reference to conventional printed circuits, the teachings are equally applicable to circuit boards and structures formed using similar or newly developed techniques in spite of a difference in the name of such structures or techniques. In FIG. 1, a printed circuit board mounting bracket 10 is schematically shown which may include any configuration of conventional bracket as may normally be employed for mounting and securing a printed circuit board in an electronic apparatus. The bracket 10 may be formed in a variety of configurations, but in the example shown, includes a first end which includes an output connector (not shown). The output connector may be either a female or male connector which conventionally includes a plurality of conductors which are attached to wires or other conductive members for distributing the electrical signals from printed circuit boards throughout the electronic apparatus. The exact structure of the output connector may be one of a variety of conventional connectors and is not critical to a further understanding of the present invention.

A printed circuit board 13 includes a mating connector 13a which again may be a male or female connector depending upon the structure of the output connector. Connector 13a, as shown, may include a plurality of conductive outputs for mating with the corresponding conductors in the output connector to distribute the signals from the printed circuit board 13 to the wires or conductive members from the output connector. The conductive outputs of connector 13a are coupled to receive the appropriate electrical signals from different parts of the circuits on the printed circuit board in a conventional manner.

The printed circuit board 13 may be conventionally formed by a variety of processes which enable the formation of electrically conductive strips 16 and terminals 18 at predetermined positions on the board to form circuit configurations. Electronic components are then electrically coupled to the terminals to form the individual electronic circuits produced by the printed circuit boards 13. In the present example, the electronic components, as depicted by resistor 14 in FIG. 1, may have their leads situated such that they extend through plated-through holes in the printed circuit board forming the terminals 18. The leads, extending through to an opposite side of the board, are then wave soldered or otherwise attached by a conventional soldering process. After all of the electronic components have been attached to their appropriate terminals, the printed circuit board 13 is considered complete and is then inserted to couple connector 13a to the output connector to produce the desired electronic controls.

In the prior art, the above construction and configuration is conventional and forms the basic printed circuit assembly which provides the electronic control for the particular device involved. One or more printed circuit boards may be mounted on the bracket 10 adjacent to one another in which case separate mounting structures and connectors are used to accommodate each of the boards. Such techniques are again conventional and do not form a part of the present invention and thus require no further description for an understanding thereof. In prior art structures, heatsinks were used in connection with the printed circuits to produce the desired heat dissipation and prevent damage to the electronic components. Depending upon the heat sinking technique employed, the printed circuit board required extensive modification prior to or subsequent to its attachment in the mounting bracket 10. In other instances a special mounting bracket was required to accommodate the special heatsink structures. In any event, the aforementioned prior art techniques required substantial and complex steps to produce effective heat dissipation in the electronic apparatus.

In accordance with the present invention, heat dissipation from the printed circuit board 13 and the electronic components as depicted by resistor 14 is provided in a simplified and more efficient manner which does not require extensive modification to the steps used in the formation of the printed circuit assembly. In the described embodiment, the conventional artwork or mask used in the process of forming the conductive strips 16 and terminals 18 on the printed circuit board 13 is used to form a heatsink plate 15 for attachment to the printed circuit board 13 for providing a printed circuit heatsink assembly which facilitates heat dissipation. As was previously mentioned, the printed circuit board 13 may be formed by a variety of conventional processes. In processes producing the conductive strip and terminal areas 16 and 18, respectively, a mask or other artwork of some form is first used to define a pattern of the areas on the surface of the board 13 on which terminals 18 and conductive strips 16 are to be formed. The artwork or mask may be a conventional photoresist mask or similar layer in which are defined the patterns for producing the areas which will form the terminals 18 and conductive strips 16. The term artwork or mask is also intended to include computer-generated patterns (as are employed in numerically controlled machining or etching techniques) and any other technique or structure which defines the pattern areas. Again, the particular technique involved is not critical to the understanding and practice of the present invention, it being understood that any process which utilizes such artwork or masks is compatible with the practice of the present technique and the formation of the inventive printed circuit heatsink assembly.

Figure 2:
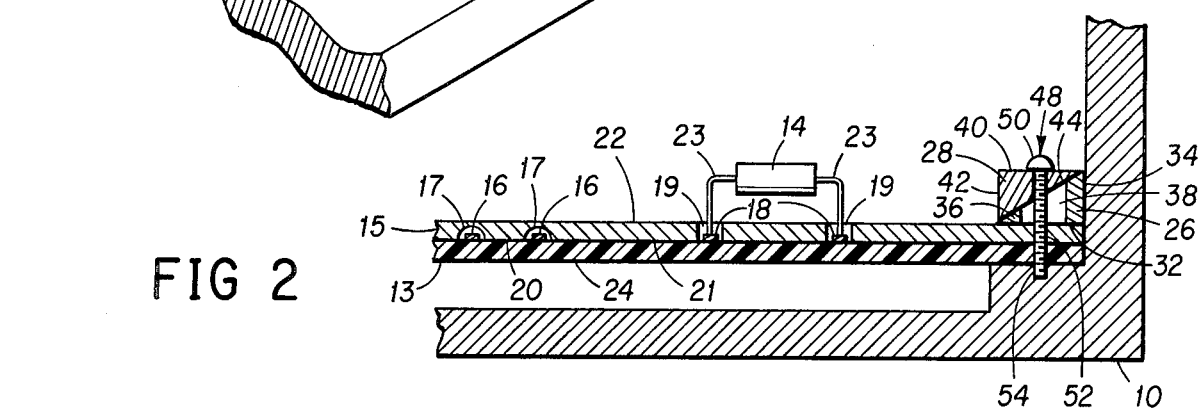
FIG. 2 is a side sectional view taken along line 2—2 in FIG. 1.

Referring again to FIG. 1, a thermally conductive member 15 may be formed by etching or milling a thermally conductive plate to remove material from one face in a pattern which corresponds to the pattern of conductive strips 16 and from both faces in a pattern which corresponds to the pattern of terminals 18 on the surface of printed circuit board 13. The etching or milling is preferably performed by chemical etchants but may be accomplished by any technique (e.g. laser etching, etc.) capable of providing the pattern of etched areas as described. More specifically, the mask used to produce the conductive strips 16 and terminals 18 may be used to produce the patterns necessary for etching plate 15 to form the removed areas. As can be seen with reference to FIG. 2, the purpose of the etching is to produce indentations in the form of channels 17 and holes 19 in the same pattern as the corresponding face of the printed circuit board 13. When the etching is performed, the etched areas 17 will be in the configuration of channels which enclose conductive strips 16 while holes 19 will surround terminals 18. When combined to form the printed circuit assembly, the plate 15 will be mounted adjacent to the printed circuit board 13 so that the etched channels 17 and holes 19 are in opposed and aligning relationship to produce electrical isolation of the plate 15 from those conductive areas 16 and 18 on the printed circuit board 13.

In order to produce the assembly, the etched plate 15 may be adhesively bonded to the printed circuit 13 so that the surface 20 of plate 15 is in thermal contact with the surface 21 of board 13 in all areas except those defined by areas 17 and 19. The adhesive may be any of a conventional type which is generally an electrically insulating material yet exhibits sufficient thermal conductivity so that when the assembly is cured, the plate 15 and board 13 are in thermally conductive contact with one another across the surface area of their mating sides 20 and 21. The adhesive may, for example, be a 0.001–0.002 inch layer of material identified as SPEED-BONDER 324 adhesive with a 707 activator as supplied by Loctite, Inc. of Newington, Conn.

In one example of the plate 15, the plate is formed in a generally rectangular configuration having opposed parallel planar surfaces 20 and 22. The plate 15 may be constructed to have the same surface dimensions in width and length as the board 13 to which it is to be mated. Naturally, the surface 21 of the board 13 on which the conductive strips 16 and terminals 18 are formed is also normally planar and makes substantially uniform contact with the surface 20 of the plate 15 when the assembly is complete. After bonding, the plate 15 and printed circuit board 13 form a single structure which comprises the printed circuit heatsink assembly. It is apparent that while the present invention has been described with reference to the planar-rectangular printed circuit board 13 and plate 15, other configurations could be employed consistent with the inventive teachings.

In forming the channels 17 and holes 19, the artwork or mask used to form the conductive strips 16 and terminals 18 on board 13 may be positioned on the surface 20 to define patterns corresponding to the areas 16 and 18 in a manner similar to that used with respect to board 13. After the patterns are defined, the surface 20 may be etched with conventional chemical etchants to form the channels 17 and partial holes 19. The pattern of channels 17 and partial holes on surface 20 is shown by the bottom view of plate 15 in FIG. 3b. The top surface 22 of the plate 15 may also be masked with the same artwork used on surface 20 except that the pattern areas defining the conductive strips 16 in the original mask are removed so that only the pattern areas defining terminals 18 remain and form patterns on surface 22. The surface 22 may then be chemically etched and the resulting etching completes the formation of holes 19 in a pattern corresponding to that of the terminals 18 on the printed circuit board 13. Alternatively, both surfaces 20 and 22 could be masked and etched together to form the channels 17 and holes 19.

Figure 3A:
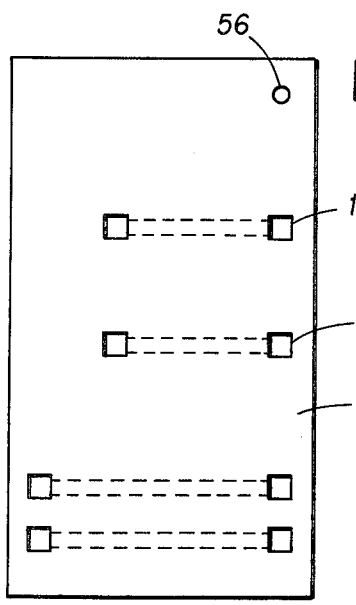
FIGS. 3a and 3b are top and bottom views of the thermally conductive plate used in the assembly of FIGS. 1 and 2.
Figure 3B:
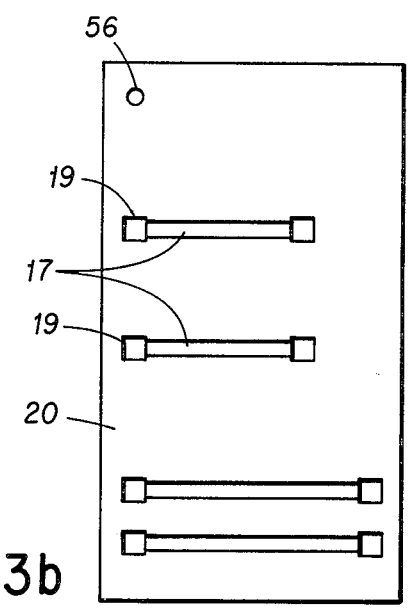

The pattern corresponding to the terminal areas 18 on surface 22 of plate 15 is shown by a top view of the plate 15 in FIG. 3a. As can be seen, during the etch of surface 20, approximately one-half of the hole 19 will be formed. Etching of the top surface 22 completes the formation of the holes 19 in areas corresponding to the positions of the terminals 18. The holes 19 could alternatively be formed by using different chemical etchants in the respective areas 16 and 18, but this would entail more complicated procedures using etchants with different etching rates. Although such a technique is acceptable, it is desirable to produce the etched areas 17 and 19 in the simplest and most efficient manner, and to that end, any technique using the original artwork or mask may be employed.

In order to produce the channels 17 and holes 19 of a size which will prevent electrical contact between the plate 15 and conductive areas 16 and 18, the artwork or mask may first be grown or photographically enlarged by a predetermined amount to produce patterns of greater dimension. Thus, in defining patterns on the surfaces 20 and 22, the original artwork or mask may be modified in a conventional manner by, for example, 0.02 inches, to produce an oversize pattern area in contrast to that originally used for the production of the conductive s rips 16 and terminals 18. When the etching is then performed on the surfaces 20 and 22, the material removed to form channels 17 and holes 19 will be sufficient to preclude electrical contact between the plate 15 and conductive areas 16 and 18 when the surface 20 is bonded in thermal contact with the surface 21 of printed circuit board 13. Although the modification of the artwork or mask is one exemplary technique for providing greater dimensions for the channels 17 and holes 19, any other technique may be used to produce the same increase in dimensions. Thus, for example, the etchant used may be such that the areas 17 and 19 are naturally increased in size prior to the achievement of the proper depth and thus inherently produce oversize areas 17 and 19 for electrically insulating the channels 17 and holes 19 from the conductive strips 16 and terminals 18, respectively.

After the attachment of plate 15 to printed circuit board 13 is complete, the electronic components, as exemplified by resistor 14, are attached to the board 13 by insertion of their electrical leads 23 through the holes 19 and into contact with terminals 18. Terminals 18 may be conventional plated-through holes in which case the leads 23 are positioned to extend through terminals 18 to the opposite surface 24 of board 13. The surface 24 is then soldered to securely and electrically couple the leads 23 of the electronic components 14 to the terminals 18. By way of example, the surface 24 of the printed circuit board 13 may be wave soldered with the leads extending through the terminals 18 to the surface 24 thereby interconnecting all of the terminals and leads of the electronic components in their appropriate manner. Any other conventional technique for bonding the electronic components to their respective terminals 18 may also be employed as long as it is compatible with the presence of the plate 15 and will not cause subsequent electrical coupling between conductive areas 16 and 18 and plate 15.

Once the electrical components have been bonded to their respective terminals, the printed circuit heatsink assembly may then be mounted to the mounting bracket 10. In accordance with the present invention, the bracket 10 is formed of a thermally conductive material, in a conventional configuration for receiving board 13. The bracket 10 may be a metal electrical conductor such as copper which is also a good thermal conductor to additionally provide grounding for printed circuit board 13. In order to provide a good thermally conductive path between the plate 15 and mounting bracket 10 an assembly including wedge elements 26 and 28 forms a clamp wherein the wedge element 26 is maintained in forceful thermally conductive contact with the surface 22 of plate 15 and in forceful thermally conductive contact with a planar surface 30 of thermally conductive mounting bracket 10.

The wedge 26 includes a first planar surface 32 which slidably contacts surface 22 of plate 15, and a second planar surface 34 which contacts a surface of bracket 10. The wedge 26 also includes a third planar surface 36 which interconnects surfaces 32 and 34 to form the triangular wedge 26. As can be seen, each of the surfaces 32 and 34 are substantially perpendicular to one another while the surface 36 is oriented to intersect surfaces 32 and 34 in such manner as to form the hypotenuse of triangular wedge element 26. The element 26 includes a slotted hole 38 which has an axis generally perpendicular to the surface 32 and parallel to the surface 34 and centrally located in the wedge 26 to extend through the surfaces 32 and 36.

The mating wedge 28 is formed of a similarly shaped element and includes substantially perpendicular first and second planar surfaces 40 and 42 and a third planar surface 44 which intersects planes 40 and 42 to form the hypotenuse of the triangular wedge element 28. The element 28 includes an opening 46 having an axis which extends generally perpendicular to the surface 40 and which extends through surface 40 and 44 for receiving the shaft of a threaded member, such as a screw or bolt 48. In construction, the wedge element 28 is made of generally smaller dimensions than the wedge element 26 so that the surface 44 measured along the hypotenuse of the triangle in the cross-section of the element 28 is of less length than the hypotenuse of the triangle formed by surface 36 in the cross-section of wedge element 26. The width of the wedge elements measured across the face of the surfaces 36 and 44 may be the same to produce an area of sliding contact between surfaces 36 and 44.

In operation, the threaded member 48 having a head 50, shaft 52 and threaded end 54, is inserted through the hole 46 in wedge element 28 so that it extends through the slotted opening 38 in the wedge element 26. At the same time, the surfaces 36 and 44 are positioned adjacent one another in sliding contact and oriented so that the surfaces 32 and 40 are substantially parallel to one another. The shaft 52 of member 48 is received in openings 38 and 46 and extends along an axis perpendicular to the surfaces 20, 21, 22 and 24. Openings 56 and 58 are formed in plate 15 and board 13, respectively, to receive the shaft 52 so that threaded end 54 may engage a mating threaded hole 60 in mounting bracket 10. When the member 48 is threaded into hole 60 in one direction, the force exerted by the head 50 on surface 40 will cause a force to be exerted through surfaces 44 and 36 causing the movement of wedge 26 parallel to the surface 22 of plate 15 and in a direction towards the surface 30 of mounting bracket 10. As the member 48 is rotated further, the wedge 26 will be forced to a position where its surface 34 is in planar and thermally conductive contact with the surface of bracket 10. Several of the wedge assemblies, including elements 26 and 28, may be used along the width of plate 15 to provide the clamping and heat conduction. Alternatively, the wedge 26 could extend the complete width of the plate 15 to provide a greater conductive area of contact for heat conduction. In this instance, a plurality of smaller wedges 28 could be used to force the single extended wedge 26 into contact with bracket 10 (in a manner similar to that described). A single wedge 28 having dimensions similar to the extended wedge 26 could also be used.

The wedge 26 may be constructed of any highly thermal conductive material such as copper to provide efficient heat transfer between plate 15 and mounting bracket 10. The wedge 28 may be made of any conventional material sufficient to provide and allow good sliding contact between surfaces 36 and 44 for movement of wedge 26 into thermally conductive contact with bracket 10. Thus, the wedge 28 may be made of aluminum to provide the sliding contact and reduce the weight of the structure. As can be seen, the movement of wedge 26 is facilitated by slot 38 so the slot 38 must be of such dimension as to allow sufficient movement of wedge 26 with respect to wedge 28 and toward bracket 10 so that the surfaces 34 and 30 can forcefully engage one another. The clamp structure thus allows simple and effective thermal coupling between the plate 15 and bracket 10 for conducting heat produced in plate 15 (by electronic components 14 and in other portions of the printed circuit board 13 in which plate 15 is in contact) to the mounting bracket 10 for dissipation away from the circuit board. The clamp and printed circuit heatsink assembly allow easy insertion and removal of the printed circuit heatsink assembly for repair or replacement.

As can be seen from the above description, the technique and printed circuit heatsink assembly described above provides improved capabilities for dissipating heat in printed circuit boards. The process of forming the plate 15 requires only small or no modifications to the artwork or masks already used in the formation of the conventional printed circuit board 13. Thus, with only minor changes, an effective heatsink can be formed for dissipating greater amounts of heat in the printed circuit board 13. Use of the already-formed artwork or mask enables a cheaper production of the assembly with additional economies being achieved by the chemical milling processes. The resulting structure covers a greater portion of the printed circuit board and thereby absorbs and distributes a greater amount of the total heat produced by the electronic components or the current flowing in the conductive areas of the circuit board. By interposing plate 15 between the electronic components (which produce most of the heat generated) and the printed circuit board 13, the heat is more readily and efficiently dissipated. The plate 15 bridges the conductive areas on the printed circuit board so that heat is removed from previously isolated parts of the printed circuit boards. Further, the possibility of shorts may be easily reduced by a simple process which modifies the dimensions of the artwork or mask prior to the milling or etching of the plate 15. The plate 15 may be primarily formed from an easily etched material such as copper, and then coated with a good thermally conductive material such as nickel, to produce a structure which in combination with the simple clamp facilitates heat transfer between the printed circuit board and mounting bracket 10. The improved efficiency of heat transfer enables more dense component interconnection on individual printed circuit boards and a closer stacking of the boards themselves on mounting bracket 10. The mounting bracket 10 may itself be cooled by air convection or other conventional liquid-cooled coupling techniques to remove the heat from the electronic apparatus. All of these are advantages that are unrecognized in the prior art.

Although the invention has been described with reference to particular configurations and structures, it is apparent that other configurations and structures could be used without departing from the above teachings. Specifically, the configuration of the connectors and mounting bracket could be changed to accommodate multiple boards while employing the same teachings of the present invention. Likewise, the electronic components could be mounted to the printed circuit board after the plate is in place using any conventional technology or techniques. The bracket 10 may include a structure enabling multiple printed circuit heatsink assemblies to be mounted in thermally conductive relationship in accordance with the above teachings. Likewise, the materials forming the heatsink and wedge structures may be changed so long as the heatsink functions are performed in accordance with the teachings herein.

Obviously, many other modifications and variations of the present invention are possible in light of the above teachings. It is therefore to be understood that within the scope of the appended claims, the invention may be practiced otherwise than as specifically described.

What is claimed is:

1. A method of forming a circuit board heatsink assembly comprising:
    defining a pattern on a surface of a circuit board;
    forming electrically conductive areas corresponding to said pattern on the surface of said circuit board;
    defining at least a portion of said pattern on a surface of a thermally conductive member;
    forming indentations in said thermally conductive member in those areas defined by said pattern;
    coupling the surface of said thermally conductive member to the surface of said circuit board so that the pattern of said electrical conductive areas corresponding to the pattern of indentations are aligned to electrically isolate said thermally electrically conductive member from said conductive areas.

2. The method of claim 1 further comprising forming the circuit board as printed circuit board.

3. The method of claim 1 wherein said step of forming said indentations comprises removing portions of said thermally conductive member in those areas defined by said pattern to form said indentations.

4. The method of claim 3 wherein said removing step comprises chemically etching said thermally conductive member to form said indentations.

5. The method of claim 1 further comprising selecting a thermally conductive member so that the surface of said circuit board and the surface of said thermally conductive member are of the same dimensions and configuration.

6. A method of forming a printed circuit heatsink assembly comprising:
    defining a pattern on a planar surface of a printed circuit board;
    forming electrically conductive areas corresponding to said pattern on the surface of said printed circuit board as electrically conductive strips and electrically conductive terminals to form a strips pattern and terminal pattern;
    defining said pattern on one surface of a thermally conductive member having opposed parallel planar surfaces;
    forming indentations in said thermally conductive member in those areas defined by said pattern to form a corresponding pattern of indentations;
    coupling the surface of said thermally conductive member to the surface of said circuit board so that the pattern of electrically conductive areas corresponding to the pattern of indentations are aligned to electrically isolate said thermally conductive member from said electrical conductive areas.

7. The method of claim 6 wherein said coupling step includes coupling the surfaces of said thermally conductive member and said circuit board using an adhesive.

8. The method of claim 6 further including the step of defining a pattern corresponding to said terminal pattern on a second surface of said thermally conductive member in alignment with the terminal patterns on said one surface of said thermally conductive member and forming indentations in those areas defined by said terminal patterns on said second surface so that holes are formed through said thermally conductive member in a pattern corresponding to said pattern of terminals on said printed circuit board.

9. The method of claim 8 further including modifying said patterns prior to defining said patterns on said thermally conductive member to increase the dimensions of those patterns defined on said thermally conductive member over those defined on said printed circuit board.

10. The process of claim 8 further comprising the step of forming said terminals as plated through holes in said printed circuit board.

11. The method of claim 10 further including the step of inserting the leads of electronic components through the holes in said thermally conductive member and electrically attaching said leads to said terminals.

12. The method of claim 11 wherein said step of attaching comprises soldering the leads to said terminals.

13. A circuit heatsink assembly comprising:
    a circuit board having a pattern of electrically conductive areas and terminal areas interconnected by selected ones of said electrically conductive areas on at least one surface of said circuit board;

a thermally conductive member having a first surface thermally coupled to the surface of said circuit board and having indentations in said first surface in a pattern corresponding to the patterns of electrically conductive and terminal areas on said circuit board; and means for maintaining the first surface of said thermally conductive member in thermally conductive contact with the surface of said circuit board and positioned such that said pattern of indentations and said pattern of electrically conductive and terminal areas are aligned to electrically isolate said thermally conductive member from said electrically conductive and terminal areas.

14. The assembly of claim 13 wherein said terminal areas on said circuit board are plated-through holes extending to a second side of said circuit board and said indentations in the areas corresponding to terminal areas in said pattern are holes extending through said thermally conductive member to a second surface of said thermally conductive member.

15. The assembly of claim 13 wherein said thermally conductive member is an electrically conductive plate constructed so that said first surface is of the same dimensions and configuration as said at least one surface of said circuit board.

16. The assembly of claim 14 further including at least one electrical component having leads extending through selected ones of said holes in said thermally conductive member and electrically coupled to corresponding terminal areas in said circuit board.

17. The assembly of claim 16 wherein said leads extend through said plated-through holes and are soldered to said terminal areas on a second side of said circuit board.

18. The assembly of claim 13 wherein said circuit board is a printed circuit board.

* * * * *